United States Patent
Park

(10) Patent No.: US 8,309,983 B2
(45) Date of Patent: Nov. 13, 2012

(54) LIGHT EMITTING DEVICE PACKAGE AND LIGHTING SYSTEM HAVING THE SAME

(75) Inventor: Sang Jae Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/069,667

(22) Filed: Mar. 23, 2011

(65) Prior Publication Data

US 2011/0233571 A1 Sep. 29, 2011

(30) Foreign Application Priority Data

Mar. 25, 2010 (KR) .................. 10-2010-0026875

(51) Int. Cl.
*H01L 33/00* (2010.01)
(52) U.S. Cl. ............. 257/99; 257/100; 257/E27.12
(58) Field of Classification Search .......... 257/99, 257/100, E27.12
See application file for complete search history.

(56) References Cited

FOREIGN PATENT DOCUMENTS

| | | |
|---|---|---|
| JP | 62-47156 | 3/1987 |
| JP | 4-163950 | 6/1992 |
| JP | 6-85133 | 3/1994 |
| JP | 8-330497 | 12/1996 |
| JP | 2004-311857 | 11/2004 |
| JP | 2007-250703 | 9/2007 |
| JP | 2008-258042 | 10/2008 |
| KR | 10-0764449 B1 | 9/2007 |
| KR | 10-0815277 B1 | 3/2008 |
| KR | 10-2009-0027530 A | 3/2009 |
| KR | 10-2009-0032869 A | 4/2009 |
| KR | 10-2009-0104512 A | 10/2009 |
| WO | WO 90/04262 | 4/1990 |
| WO | WO 00/02262 | 1/2000 |

OTHER PUBLICATIONS

Korean Notice of Allowance dated Jul. 26, 2011 issued in Application No. 10-2010-0026875.
Japanese Office Action dated Sep. 4, 2012 for Application 113085P.

*Primary Examiner* — Long Pham
(74) *Attorney, Agent, or Firm* — KED & Associates, LLP

(57) ABSTRACT

Provided is a light emitting device package. The light emitting device package includes a body having a cavity, a plurality of lead frames within the cavity, a light emitting device on at least one of the plurality of lead frames, and a moisture permeation prevention member between each of the lead frames and the body. Each of the lead frames includes a first frame disposed within the cavity, a second frame disposed on a lower surface of the body, and a third frame connecting the first frame to the second frame. The second frame of the lead frames is disposed within the body and at least one portion of the second frame is inclined with respect to the lower surface of the body. The moisture permeation prevention member is disposed on at least third frame of each of the lead frames.

20 Claims, 6 Drawing Sheets

LIGHT EMITTING DEVICE PACKAGE AND LIGHTING SYSTEM HAVING THE SAME

CROSS-REFERENCE TO RELATED APPLICATIONS

The present application claims priority under 35 U.S.C. §119(a) of Korean Patent Application No. 10-2010-026875 filed on Mar. 25, 2010, which is hereby incorporated by reference in its entirety.

BACKGROUND

Embodiments relate to a light emitting device package and a lighting system having the same.

Due to their physical and chemical characteristics, Group III-V nitride semiconductors are being esteemed as core materials for light-emitting devices such as light-emitting diodes (LEDs) and laser diodes (LDs). Each of the Group III-V nitride semiconductors is formed of a semiconductor material having a compositional formula of $In_xAl_yGa_{1-x-y}N$ ($0 \leq x \leq 1$, $0 \leq y \leq 1$, $0 \leq x+y \leq 1$).

LEDs are a kind of semiconductor device that is used as a light source or uses the characteristics of compound semiconductors to convert electricity into infrared rays or light, thereby receiving or transmitting signals therebetween.

These semiconductor based LEDs or LDs are widely used in light-emitting devices, and are applied as light sources for various products such as keypad light-emitting units of mobile phones, electric light panels, and illumination devices.

SUMMARY

Embodiments provide a light emitting device package having a moistureproof structure.

Embodiments provide a light emitting device package capable of preventing moisture from being permeated through an interface between a lead frame and a body.

Embodiments provide a light emitting device package capable of delaying moisture permeation due to a structure of a lead frame including a bent part.

Embodiments provide a light emitting device package in which an adhesion layer is disposed between a lead frame and a body.

Embodiments provide a light emitting device package including a protrusion on a lead frame.

Embodiments improve reliability of a light emitting device package and a lighting system including the same.

In one embodiment, a light emitting device package includes: a body having a cavity; a plurality of lead frames within the cavity; a light emitting device on at least one of the plurality of lead frames; and a moisture permeation prevention member between each of the lead frames and the body, wherein each of the lead frames comprises a first frame disposed within the cavity, a second frame disposed on a lower surface of the body, and a third frame connecting the first frame to the second frame, the third frame of the lead frames is disposed within the body and at least one part of the third frame is inclined with respect to the lower surface of the body, and the moisture permeation prevention member is disposed on at least third frame of each of the lead frames.

In another embodiment, a light emitting device package includes: a body having a cavity; a plurality of lead frames within the cavity; a light emitting device on at least one of the plurality of lead frames; and a moisture permeation prevention member between each of the lead frames and the body, wherein each of the lead frames comprises a first frame disposed within the cavity, a second frame disposed on a lower surface of the body, and a third frame connecting the first frame to the second frame, and wherein the moisture permeation prevention member comprises an uneven part disposed on at least one of top and lower surfaces of at least one of the first and third frames.

In further another embodiment, a lighting system includes: a board; a plurality of light emitting device packages on the board; an optical member disposed on an optical path of the plurality of light emitting device packages, wherein each of the light emitting device packages includes: a body having a cavity; a plurality of lead frames within the cavity; a light emitting device on at least one of the plurality of lead frames; and a moisture permeation prevention member between each of the lead frames and the body, wherein each of the lead frames comprises a first frame disposed within the cavity, a second frame disposed on a lower surface of the body, and a third frame connecting the first frame to the second frame, and wherein the moisture permeation prevention member comprises an uneven part disposed on at least one of top and lower surfaces of at least one of the first and third frames.

The details of one or more embodiments are set forth in the accompanying drawings and the description below. Other features will be apparent from the description and drawings, and from the claims.

DETAILED DESCRIPTION OF THE EMBODIMENTS

Figure 1:
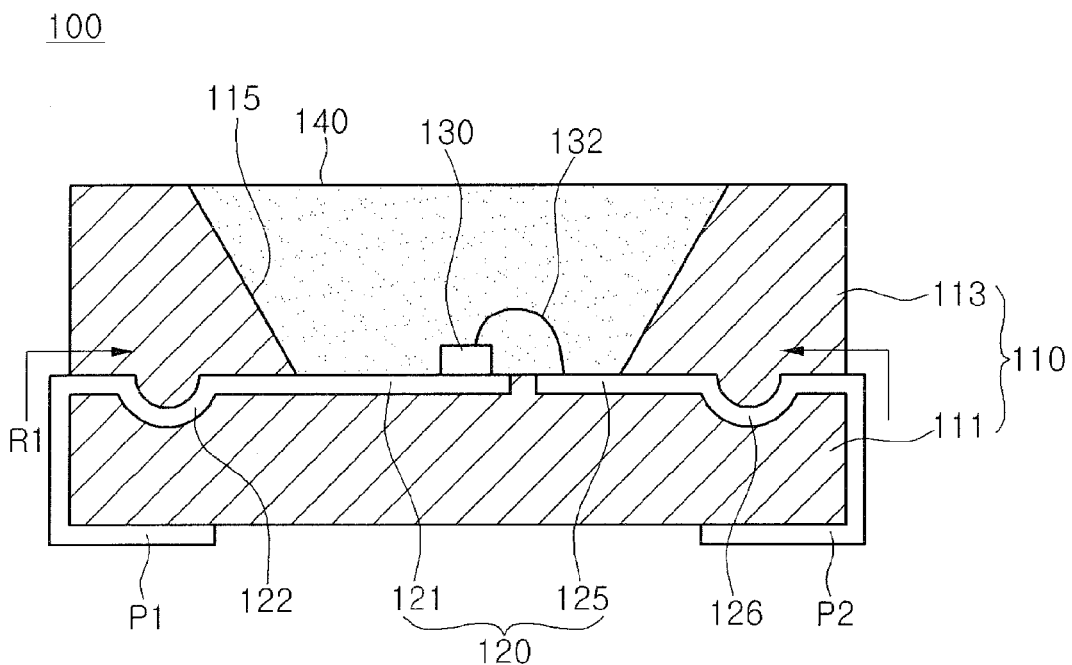
FIG. 1 is a side sectional view of a light emitting device package according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIG. 1 is a side sectional view of a light emitting device package according to a first embodiment.

Referring to FIG. 1, a light emitting device package 100 includes a body 110, lead frames 120 (121, 125), a light emitting device 130, and a molding member 140.

The body 110 may be formed of at least one of a resin material such as polyphthalamide (PPA), silicon (Si), a metal material, photo sensitive glass (PSG), sapphire ($Al_2O_3$), and a printed circuit board (PCB). Alternatively, the body 110 may be formed of at least one material of silicon carbide (SiC), aluminum nitride (AlN), liquid crystal polymer (LCP), but is not limited thereto. Hereinafter, for convenience of description, the body 110 formed of the resin material will be described as an example.

The body 110 may have various shapes such as a square shape, a polygonal shape, and a circular shape in an outer appearance according to the use and design of the light emitting device package 100. For example, the light emitting device package 100 may have a polygonal shape, but is not limited thereto. The light emitting device package 100 may be used for an edge-type or direct-type backlight unit according to its mounted configuration.

The body 110 includes a support part 111 and a reflective part 113. The support part 111 is disposed under a bottom surface of a cavity 115. The reflective part 113 is disposed above the support part 111 and has the cavity 115. The reflective part 113 may be defined as a cup portion according to a configuration of the cavity 115, but is not limited thereto.

The body 110 may be divided into the support part 111 and the reflective part 113 by inner parts of the lead frames 120 (121, 125). The reflective part 113 may be formed of the same material as that of the support part 111 or a material different from that of the support part 111, but is not limited thereto.

The cavity 115 has an opened upper side. The cavity 115 may have an upper portion wider than a lower portion thereof. The cavity 115 may have a recessed structure such as a cup shape or a concave container shape. A periphery of the cavity 115 may have a vertical side surface or inclined side surface with respect to a bottom surface thereof.

The cavity 115 may have a polygonal shape when viewed from an upper side. Alternatively, the cavity 115 may have a shape having a predetermined curvature such as a circular or oval shape. Alternatively, the cavity 115 may have a curved shape at an edge portion thereof.

Also, a cathode mark may be disposed on the body 110. The cathode mark may prevent polarities of the lead frames 120 (121, 125) from being confused.

The plurality of lead frames 121 and 125 are disposed on the body 110. The plurality of lead frames include a first lead frame 121 and a second lead frame 125. The inner parts of the first and second lead frames 121 and 125 are disposed within the cavity 115 and electrically separated from each other. The inner parts of the first and second lead frames 121 and 125 pass through the body 110.

The inner parts of the first and second lead frames 121 and 125 are disposed on the bottom surface of the cavity 115, and outer parts of the first and second lead frames 121 and 125 are disposed on at least side surfaces of the body 110. Ends of the first and second lead frames 121 and 125 may be disposed on a lower surface of the support part 111 of the body 110 and used as lead electrodes P1 and P2.

The outer parts of the first and second lead frames 121 and 125 are disposed on both side surfaces of the body 110, respectively. Both side surfaces of the body 110 may be surfaces different from each other or surfaces opposite to each other.

The lead frames 120 (121, 125) include a moisture permeation prevention member. The moisture permeation prevention member includes bent parts 122 and 126 at which portions of the first and second frames 121 and 125 are bent, respectively. The bent parts 122 and 126 may have a concave or convex portion. The concave portion has a structure in which a portion of each of the lead frames 121 and 125 is bent in a concave shape with respect to the bottom surface of the cavity 115, and the convex portion has a structure in which a portion of each of the lead frames 121 and 125 is bent in a convex shape with respect to an extending line of the bottom surface of the cavity 115. The concave or convex portion may have a side section having a hemispherical or polygonal shape.

The bent parts 122 and 126 are disposed on the inner part of each of the lead frames 121 and 125. Particularly, the bent parts 122 and 126 may be disposed at each of the lead frames 121 and 125 disposed within the body 110.

The bent parts 122 and 126 may increase a surface area of each of the lead frames 121 and 125. The bent parts 122 and 126 may increase a moisture permeation path R1 proceeding along a surface of each of the lead frames 121 and 125 within the body 110. The moisture permeation prevention member may improve electrical reliability of the light emitting device 130 according to moisture permeation. Each of the bent parts 122 and 126 may have a width at least greater than that of the light emitting device 130. The widths of the bent parts 122 and 126 may effectively delay the moisture permeation.

Also, the bent parts 122 and 126 of the lead frames 120 (121, 125) may delay or block the moisture permeation.

Alternatively, each of the bent parts 122 and 126 of the lead frames 121 and 125 is formed in plurality. The plurality of bent parts 122 and 126 may delay or block the moisture permeation at each of the lead frames 121 and 125.

Also, the bent parts 122 and 126 of the lead frames 121 and 125 may enhance a coupling force with the body 110 to block the moisture permeation.

The first and second lead frames 121 and 125 may be formed of a metal material, e.g., at least one selected from the group consisting of Ti, Cu, Ni, Au, Cr, Ta, Pt, Sn, Ag, and P. Each of the first and second lead frames 121 and 125 may have a single or multi layer structure using at least one metal.

Each of the first and second lead frames 121 and 125 may have a thickness of about 0.1 mm to about 0.5 mm, and more particularly, a thickness of about 0.1 mm to about 0.3 mm.

The first and second lead frames 121 and 125 are electrically connected to the light emitting device 130 to supply a power into the light emitting device 130.

The light emitting device 130 is disposed within the cavity 115. Also, the light emitting device 130 may be disposed on one of the first and second lead frames 121 and 125. Here, the light emitting device 130 is bonded to the first lead frame 121 and connected to the second lead frame 125 using a wire 132. Alternatively, the plurality of lead frames 121 and 125 may be connected to the light emitting device 130 using a plurality of wires, or a flip bonding process or a wire bonding process may be selectively performed to connect the lead frames 121 and 125 to the light emitting device 130, but is not limited thereto.

The light emitting device 130 may be an LED (light emitting diode) chip which emits light having visible bands such as blue light, green light, and red light or an UV (ultraviolet) LED. The light emitting device 130 may include an LED chip formed of a group III-V element compound semiconductor, e.g., AlInGaN, InGaN, GaN, GaAs, InGaP, AlInGaP, InP, or InGaAs-based semiconductor.

At least one light emitting device 130 may be disposed within the cavity 115.

The molding member 140 may be disposed within the cavity 115. The molding member 140 may be formed of a transparent resin material such as silicon or epoxy. The molding member 140 may have a surface having a flat shape, a concave shape, or a convex shape. A phosphor may be added to the molding member 140. The phosphor may be a fluorescent material which absorbs a portion of light emitted from the light emitting device 130 to emit light having wavelengths different from each other. The phosphor may selectively include colored light emitting phosphors such as a yellow phosphor, a blue phosphor, a green phosphor, and a red phosphor. The phosphor may be formed of at least one of YAG, TAG, Silicate, Nitride, Oxynitride-based materials.

A lens may be disposed on the molding member 140. The lens may have a convex lens shape and/or a concave lens shape. The lens may be changed in shape according to light distribution. A protection device such as a Zener diode for protecting the light emitting device 130 may be disposed within the light emitting device package 100.

The light emitting device package 100 may be arrayed on a board and used as light sources for indicating devices, display devices, and lighting devices.

Figure 2:
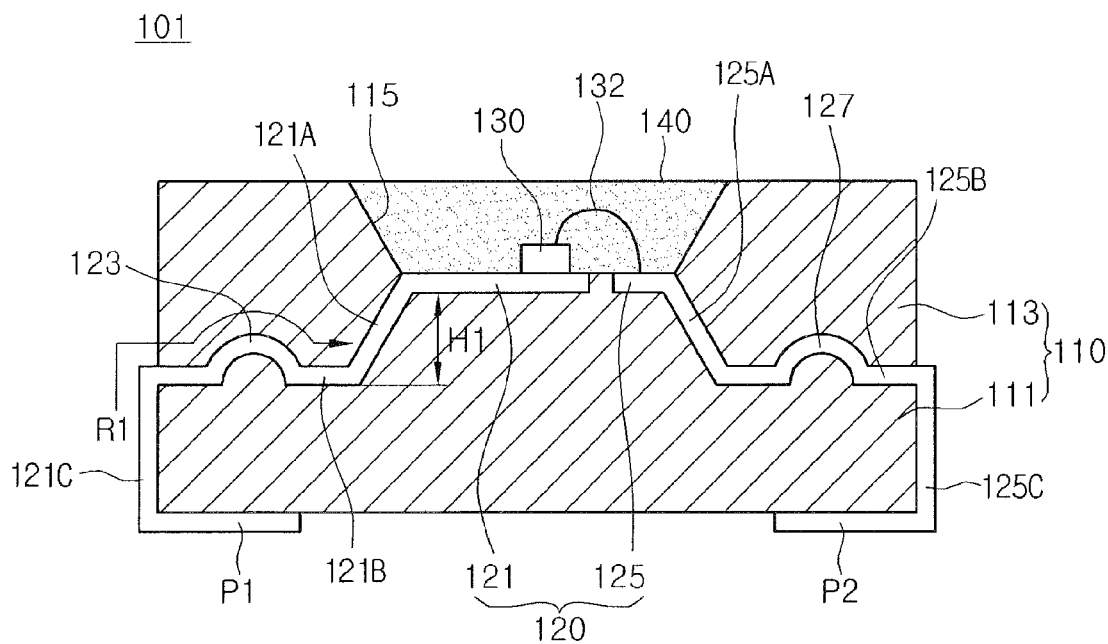
FIG. 2 is a side sectional view of a light emitting device package according to a second embodiment.

FIG. 2 is a side sectional view of a light emitting device package according to a second embodiment. In description of FIG. 2, the same part as that of the first embodiment shown in FIG. 1 will be denoted by the same reference numeral and described with reference to the first embodiment.

Referring to FIG. 2, a light emitting device package 101 has a structure in which bent parts 123 and 127 are respectively disposed on lead frames 120 (121, 125).

Portions of the first and second lead frames 121 and 125 may protrude in a convex shape from a lower surface of a body 110 to form the bent parts 123 and 127.

The first lead frame 121 includes a first frame disposed on a bottom surface of a cavity 115, a second frame disposed on a lower surface of the body 110, and third frames 121A and 121B connecting the first frame to the second frame. A light emitting device 130 is disposed on the first frame, and the second frame may be a lead electrode. The third frames 121A and 121B include an inclined part 121A and an extension part 121B which are disposed within the body 110. The inclined part 121A is inclined with respect to the bottom surface of the cavity 115. The inclined part 121A may be inclined at an angle of about 15° to about 75° with respect to an extending line of the bottom surface of the cavity 115. The extension part 121B is connected to the other end of the inclined part 121A and extends in a direction parallel to the bottom surface of the cavity 115. The bent part 123 is disposed on the extension part 121B. An outer part 121C of the first lead frame 121 is connected to the extension part 121B and bent toward the lower surface of the body 110.

The extension part 121B of the first lead frame 121 is disposed between the bottom surface of the cavity 115 and the lower surface of the body 110 and spaced a predetermined distance H1 from the extending line of the bottom surface of the cavity 115.

The second lead frame 125 include a first frame disposed on the bottom surface of the cavity 115, a second frame disposed on the lower surface of the body 110, and third frames 125A and 125B connecting the first frame to the second frame.

The third frames 125A and 125B include an inclined part 125A and an extension part 125B which are disposed within the body 110. The inclined part 125A is inclined with respect to the bottom surface of the cavity 115. For example, the inclined part 125A may be inclined at an angle of about 15° to about 75° with respect to the extending line of the bottom surface of the cavity 115. The extension part 125B is connected to the other end of the inclined part 125A and extends in a direction parallel to the bottom surface of the cavity 115. The bent part 127 is disposed on the extension part 125B. An outer part 125C of the second lead frame 125 is connected to the extension part 125B and bent toward the lower surface of the body 110.

The extension part 125B of the second lead frame 125 is disposed between the bottom surface of the cavity 115 and the lower surface of the body 110 and spaced a predetermined distance H1 from the extending line of the bottom surface of the cavity 115.

The bent parts 123 and 127 may be respectively disposed on middle portions of the lead frames 121 and 125 to block moisture permeation. Alternatively, a plurality of bent parts 123 and 127 may be disposed on a middle portion of each of the first and second lead frames 121 and 125. As a result, the moisture permeation may be further prevented by this structure.

The bent parts 123 and 127 of the lead frames 121 and 125 may be disposed at positions more close to side surfaces of the body 110 than the light emitting device 130. Electrical reliability of the light emitting device package 101 may be further improved according to the positions of the bent parts 123 and 127. Alternatively, the bent parts 123 and 127 may be further disposed on the inclined parts 121A and 125A of the lead frames 121 and 125, respectively.

Figure 3:
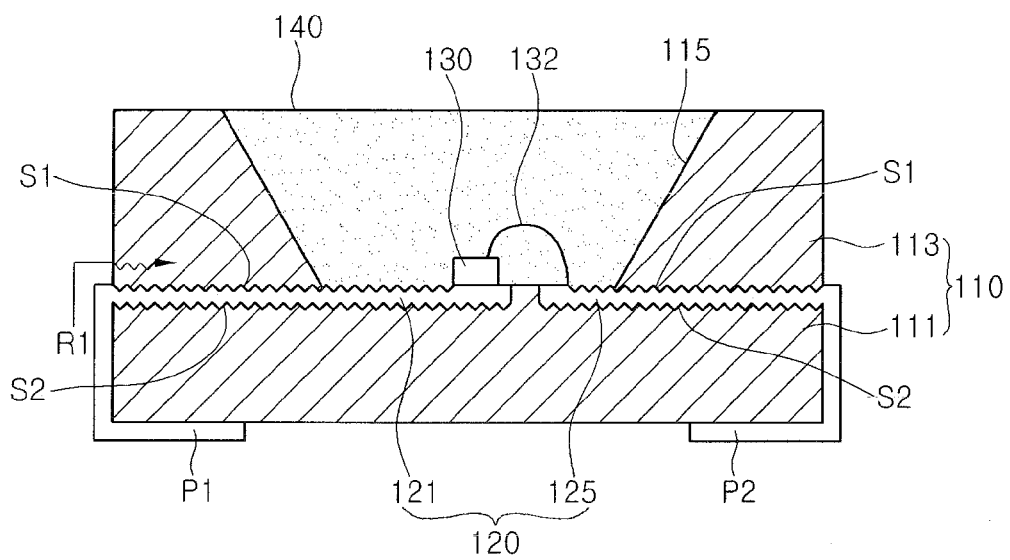
FIG. 3 is a side sectional view of a light emitting device package according to a third embodiment.

FIG. 3 is a side sectional view of a light emitting device package according to a third embodiment. In description of FIG. 3, the same part as those of the foregoing embodiments will be described with reference to the foregoing embodiments.

Referring to FIG. 3, lead frames 120 (121, 125) of a light emitting device package 102 include uneven parts S1 and S2 as a moisture permeation prevention member. The uneven parts S1 and S2 may be disposed on top and/or lower surfaces of the lead frames 120 (121, 125). Each of the uneven parts S1 and S2 may have a triangular shape in section. Alternatively, each of the uneven parts S1 and S2 may have a polygonal or curved shape in section.

The uneven parts S1 and S2 may have a spiral shape, a ring shape, or a loop shape along a periphery of each of the lead frames 121 and 125, but is not limited thereto.

The first uneven part S1 may have a depth within a range of about 20% of a thickness of each of the lead frames 121 and 125 with respect to a top surface of each of the lead frames 121 and 125. The second uneven part S2 may have a depth within a range of about 20% of a thickness of each of the lead frames 121 and 125 with respect to a lower surface of each of the lead frames 121 and 125.

The uneven parts S1 and S2 of the lead frames 121 and 125 may be disposed on the body 110 and the cavity 115.

The uneven parts S1 and S2 of the lead frames 121 and 125 may be arranged in a width direction of the lead frames 120. Also, each of the uneven parts S1 and S2 may selectively have a line pattern, an inclined pattern, a "<" shaped pattern, and a ">" shaped pattern. Here, a convex portion and a concave portion may be alternately arranged on each of the uneven parts S1 and S2 to delay or block the moisture permeation.

The uneven parts S1 and S2 of the lead frames 121 and 125 may block moisture moving along the lead frames 121 and 125. Thus, the light emitting device 130 disposed on the first lead frame 121 may be improved in electrical reliability.

Each of the uneven parts S1 and S2 of the lead frames 121 and 125 may have continuous patterns or discontinuous patterns. Also, each of the uneven parts S1 and S2 may have the same size (height or pitch) as each other or sizes (heights or pitches) different from each other.

Figure 4:
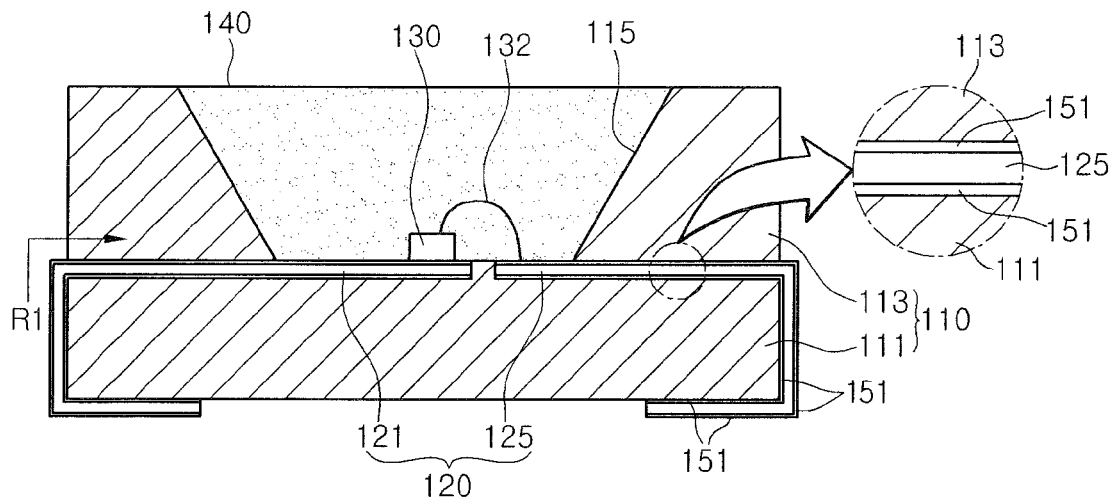
FIG. 4 is a side sectional view of a light emitting device package according to a fourth embodiment.

FIG. 4 is a side sectional view of a light emitting device package according to a fourth embodiment. In description of FIG. 4, the same part as those of the foregoing embodiments will be denoted by the same reference numeral and described with reference to the foregoing embodiments.

Referring to FIG. 4, a light emitting device package 103 includes an adhesion layer 151 as a moisture permeation prevention member. The adhesion layer 151 may be disposed on lead frames 121 and 125. Also, the adhesion layer 151 may be coated on the entire surfaces of the lead frames 121 and 125.

The adhesion layer 151 may be disposed on an area except portions of areas of the lead frames 121 and 125. Here, the portions of the areas of the lead frames 121 and 125 may include an area in which a light emitting device 130 is bonded and an area in which a wire 132 is bonded. The portions of the areas of the lead frames 121 and 125 may be electrically connected to the light emitting device 130. Alternatively, the portions of the areas of the lead frames 121 and 125 may be top surfaces of the lead frames 121 and 125 disposed on a bottom surface of a cavity 115, but is not limited thereto.

The adhesion layer 151 may be a layer including an adhesive such as a primer. The adhesion layer 151 may be formed of a resin material such as a silicon, epoxy, or acryl-based material. The adhesion layer 151 is coated on surfaces of the lead frames 121 and 125 before a body 110 is injection-molded. The adhesion layer 151 may be disposed between the body 110 and the lead frames 121 and 125 to enhance an adhesion force therebetween. The adhesion layer 151 may prevent moisture from being permeated through an interface between the body 110 and each of the lead frames 121 and 125.

Also, the adhesion layer 151 may be adhere to a lower surface of a molding member 140 to prevent moisture from being permeated between the adhesion layer 151 and the molding member 140.

The adhesion layer 151 may adhere to the molding member 140 to prevent a lower portion of the molding member 140 from coming off due to thermal expansion.

Figure 5:
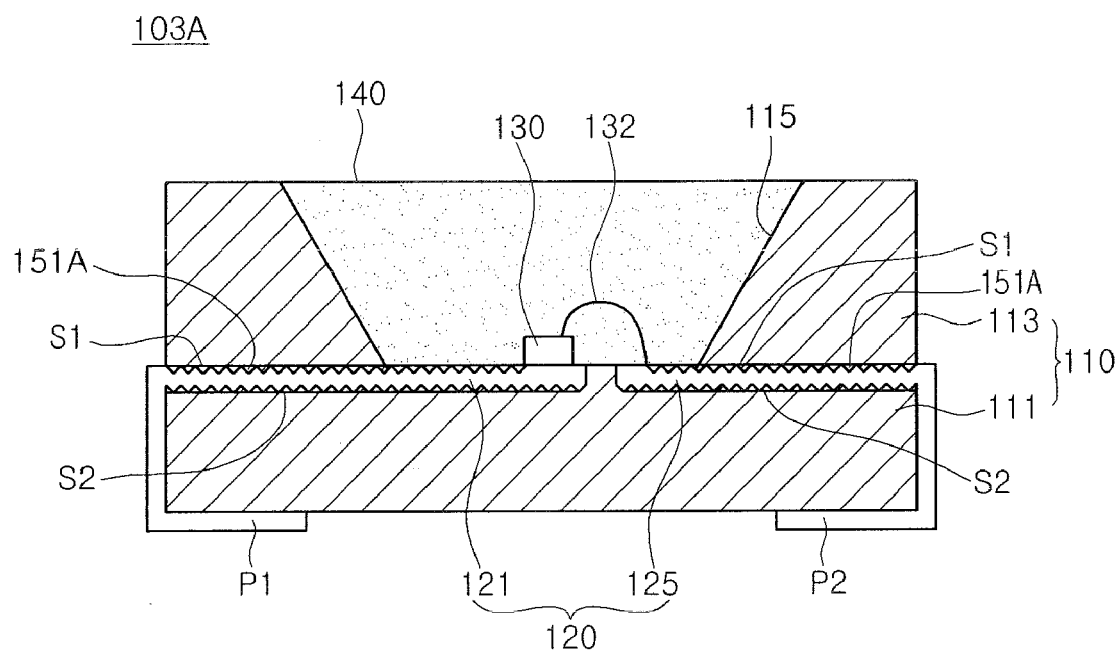
FIG. 5 is a side sectional view of a light emitting device package according to a fifth embodiment.

FIG. 5 is a side sectional view of a light emitting device package according to a fifth embodiment. In description of FIG. 5, the same part as those of the foregoing embodiments will be denoted by the same reference numeral and described with reference to the foregoing embodiments.

Referring to FIG. 5, a light emitting device package 103A has uneven parts S1 and S2 on first and second lead frames 121 and 125 and an adhesive 151A on a concave portion of each of the uneven parts S1 and S2.

The uneven parts S1 and S2 of each of the lead frames 121 and 125 are disposed within a body 110 and on a bottom surface of a cavity 115. The adhesive 151A is disposed on the concave portion of each of the uneven parts S1 and S2.

The adhesive 151A may be formed of a resin material such as a silicon, epoxy, or acryl-based material.

The adhesive 151A and a convex portion of each of the uneven parts S1 and S2 alternately contact the body 110. The convex portions of the uneven parts S1 and S2 respectively contact areas different from each other within the body 110 to delay moisture permeation. Also, the adhesive 151A may adhere to the body 110 to block movement of moisture.

The concave or convex portion of each of the uneven parts S1 and S2 may have a polygonal shape such as a triangular shape or a square shape.

A top surface of the adhesive 151A is disposed at a height lower than that of a virtual line connecting the convex portions of each of the uneven parts S1 and S2 to each other. Also, the concave portion of each of the uneven parts S1 and S2 may have a depth less than a range of about 20% of a thickness of each of the lead frames 121 and 125.

Figure 6:
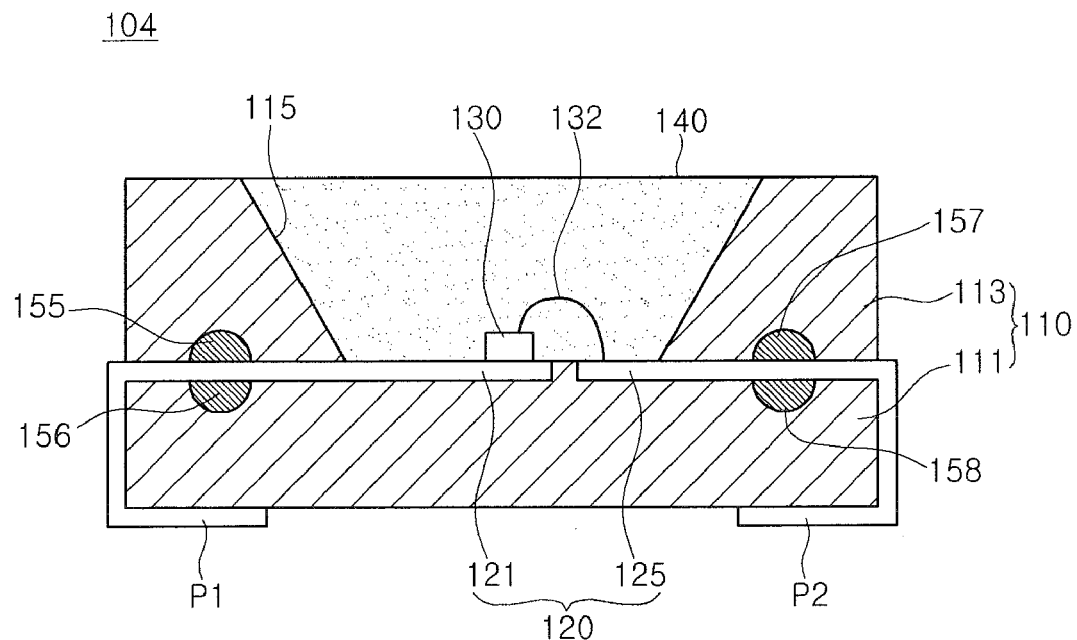
FIG. 6 is a side sectional view of a light emitting device package according to a sixth embodiment.

FIG. 6 is a side sectional view of a light emitting device package according to a sixth embodiment. In description of FIG. 6, the same part as those of the foregoing embodiments will be denoted by the same reference numeral and described with reference to the foregoing embodiments.

Referring to FIG. 6, a light emitting device package 104 has at least one protrusion 155, 156, 157, or 158 on each of lead frames 121 and 125. The protrusion 155, 156, 157, or 158 serves as a moisture permeation prevention member.

The protrusion 155, 156, 157, or 158 may protrude a surface of each of the lead frames 121 and 125. The first protrusion 155 may be disposed on the first lead frame 121 and/or the second protrusion 156 may be disposed under the first lead frame 121. Also, the first and second protrusions 155 and 156 may be disposed on positions opposite to that of the first lead frame 121 or on positions different from each other.

The third protrusion 157 may be disposed on the second lead frame 125 and the fourth protrusion 158 may be disposed under the second lead frame 125. Also, the third and fourth protrusions 157 and 158 may be disposed on positions opposite to that of the second lead frame 125 or on positions different from each other.

The protrusion 155, 156, 157, or 158 may have a dam shape, a ring shape, or a loop shape on a surface of each of the lead frames 121 and 125 within a body 110. The protrusion 155, 156, 157, or 158 may serve as a dam against moisture permeated into the surface of each of the lead frames 121 and 125. The protrusion 155, 156, 157, or 158 may have a hemispherical shape. Also, the protrusion 155, 156, 157, or 158 may be provided in one or plurality.

The protrusion 155, 156, 157, or 158 may be foamed of the same material as those of the lead frames 121 and 125 or a metal material different from those of the lead frames 121 and 125. For example, the metal material may include at least one alloy or two or more alloys of Ti, Cu, Ni, Au, Cr, Ta, Pt, Sn, Ag, and P.

The protrusion 155, 156, 157, or 158 may be formed of a resin material such as an adhesive having a superior adhesion force with a body 110. For example, the protrusion 155, 156, 157, or 158 may be formed of a resin material such as silicon (e.g., including 0E6450), epoxy, or acryl.

The protrusion 155, 156, 157, or 158 disposed on each of the lead frames 121 and 125 may prevent moisture from being permeated from the outside of inside the body 110 to the inside to electrically protect the light emitting device 130.

Figure 7:
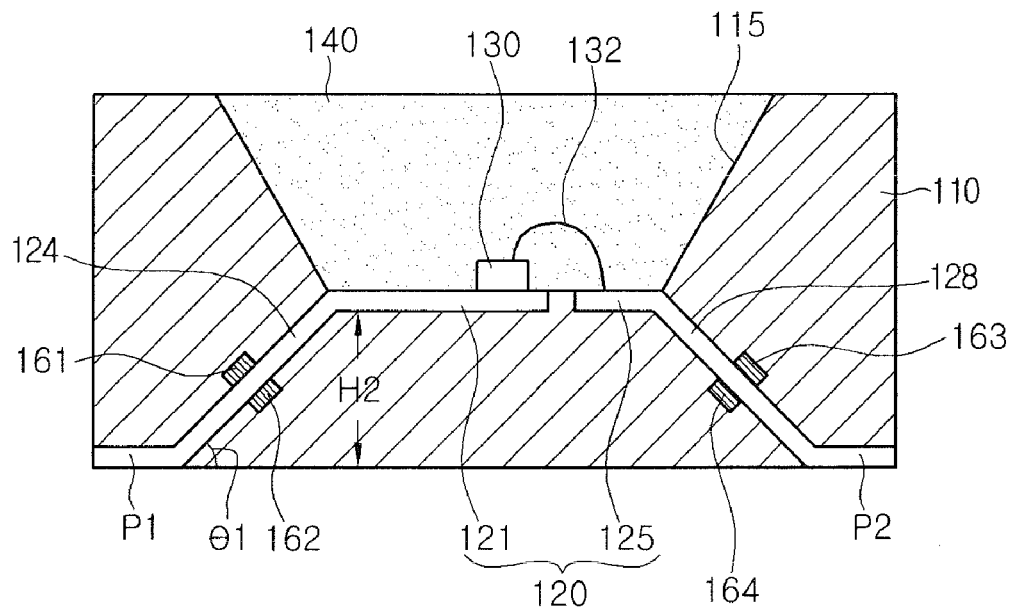
FIG. 7 is a side sectional view of a light emitting device package according to a seventh embodiment.

FIG. 7 is a side sectional view of a light emitting device package according to a seventh embodiment. In description of FIG. 7, the same part as those of the foregoing embodiments will be denoted by the same reference numeral and described with reference to the foregoing embodiments.

Referring to FIG. 7, a light emitting device package 105 includes protrusions 161, 162, 163, and 164 on lead frames 120 (121, 125).

Each of the lead frames 121 and 125 includes a first frame disposed on a bottom surface of a cavity 115, a second frame disposed on a bottom surface of a body 110, and third frames 124 and 128 connecting the first frame to the second frame. A light emitting device 130 is disposed on the first frame of the first lead frame 121. The second frame of each of the lead frames 121 and 125 serves as a lead electrode. The third frames 124 and 128 of each of lead frames 121 and 125 may have an inclined structure and include the protrusions 161, 162, 163, and 164.

The protrusions 161, 162, 163, and 164 may serve as a moisture permeation prevention member and be formed of one selected from an adhesion material, a metal material, and a resin material. Alternatively, the protrusions 161, 162, 163, and 164 may be formed of a resin material such as silicon or epoxy. For example, the resin material of the above-described materials may enhance an adhesion force with a body 110 to prevent moisture from being permeated.

The protrusions 161, 162, 163, and 164 may be formed of the same material as those of the lead frames 121 and 125 or a material different from those of the lead frame 121 and 125.

Here, the first frame of the first lead frame 121 is disposed on the bottom surface of the cavity 115, and the second frame is disposed on the lower surface of the body 110. An inclined part 124 of the first lead frame 121 has an inclined structure between the first frame and the second frame. Also, the inclined part 124 of the first lead frame 121 may be inclined at an angle θ1 of about 15° to about 75°. The inclined part 124 of the first lead frame 121 may have a height H2 defined as a thickness between the lower surface of the body 110 and the bottom of the cavity 121.

The protrusions 161 and 162 may be disposed on top and lower surfaces of the inclined part 124 of the first lead frame 121. Alternatively, the protrusions 161 and 162 may be integrally formed along a circumference of the inclined part 124.

The first frame of the second lead frame 125 is disposed on the bottom surface of the cavity 115, and the second frame is disposed on the lower surface of the body 110. An inclined part 128 of the second lead frame 125 has an inclined structure between the first frame and the second frame. An inclined angle or height of the inclined part 128 with respect to the lower surface of the body 110 will be described with reference to the structure of the first lead frame 121, The protrusions 163 and 164 may be disposed on top and lower surfaces of the inclined part 128 of the second lead frame 125. Alternatively, the protrusions 163 and 164 may be integrally formed along a circumference of the inclined part 128.

The first and second lead frames 121 and 125 may be realized in a slugger type. The protrusions 161, 162, 163, and 164 for preventing the moisture from being permeated are disposed on a middle portion within the body 110.

The protrusions 161, 162, 163, and 164 may be provided in one or plurality. Each of the protrusions 161, 162, 163, and 164 may have a polygonal shape, a ring shape, a band shape, or a loop shape.

The first protrusion 161 and the second protrusion 162 of the first lead frame 121 may be disposed on sides opposite to each other or on positions different from each other.

The first protrusion 163 and the second protrusion 164 of the second lead frame 125 may be disposed on sides opposite to each other or on positions different from each other.

The protrusions 161, 162, 163, and 164 may be disposed on the inclined parts 124 and 128 of the first and second lead frames 121 and 125 to prevent the moisture from being permeated.

Figure 8:
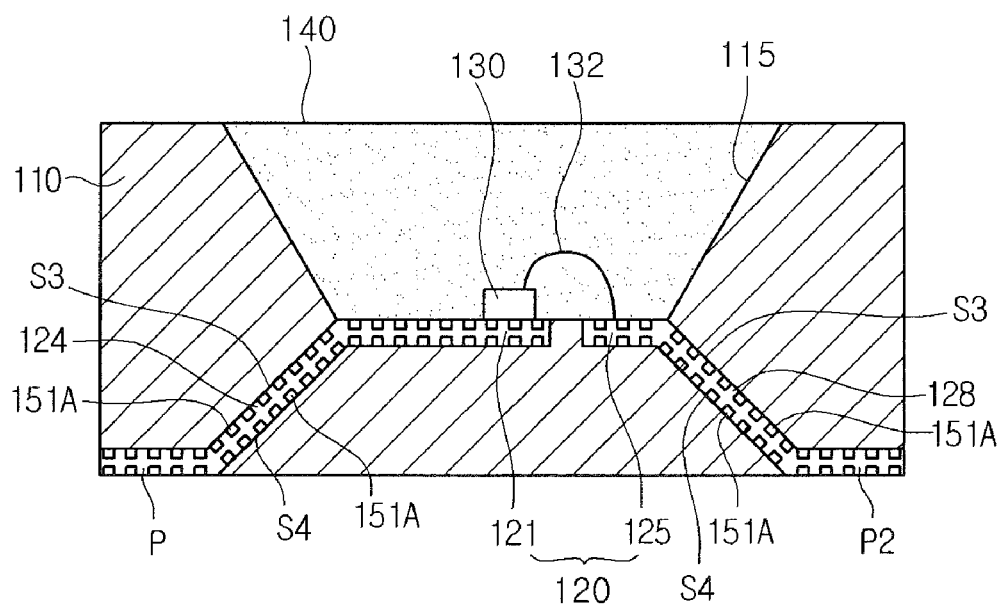
FIG. 8 is a side sectional view of a light emitting device package according to an eighth embodiment.

FIG. 8 is a side sectional view of a light emitting device package according to an eighth embodiment. In description of FIG. 8, the same part as those of the foregoing embodiments will be denoted by the same reference numeral and described with reference to the foregoing embodiments.

Referring to FIG. 8, a light emitting device package 105A includes a moisture permeation prevention member. The moisture permeation prevention member includes uneven parts S3 and S4 of lead frames 120 (121, 125) and an adhesive 151 disposed on a concave portion of each of the uneven parts S3 and S4.

Each of the lead frames 121 and 125 includes a first frame disposed on a bottom surface of a cavity 115, a second frame disposed on a bottom surface of a body 110, and third frames 124 and 128 connecting the first frame to the second frame. The third frames 124 and 128 of each of lead frames 121 and 125 may have an inclined structure and include the uneven parts S3 and S4.

The uneven parts S3 and S4 may be disposed on at least one of top and lower surfaces of each of the lead frames 121 and 125.

Each of the uneven parts S3 and S4 and the adhesive 151 may serve as a moisture permeation prevention member and be formed of one selected from an adhesion material, a metal material, and a resin material. Alternatively, each of the uneven parts S3 and S4 and the adhesive 151 may be formed of a resin material such as silicon or epoxy. For example, the resin material of the above-described materials may enhance an adhesion force with a body 110 to prevent moisture from being permeated.

A convex portion of each of the uneven parts S3 and S4 has a flat surface to increase an area adhering to a body 110. The adhesive 151 disposed on a concave portion of each of the uneven parts S3 and S4 adheres to the body 110. Thus, the convex portion of each of the uneven parts S3 and S4 and the adhesive 151 may respectively contact the body 110 to delay the moisture permeation. Also, each of the lead frames 121 and 125 includes inclined parts 124 and 128. Each of the inclined parts 124 and 128 has an inclined structure with respect to the lower surface of the body 110.

Although the plurality of lead frames are provided in the embodiments, one lead frame may be disposed on the body 110 and the rest portions may have through-hole structures. Also, the lead frame may have one side disposed within the cavity 115 and the other side branched into a plurality of branch configurations outside the body 110. Such a structure may be variously changed within the technical scope of the embodiments.

According to the embodiments, the moisture permeation prevention member may be disposed on the lead frame to block the moisture permeation. Also, the embodiments may improve the reliability of the light emitting device package. Also, the embodiments may improve a limitation in which the outer lead frame of the light emitting device package is deteriorated in electrical property during the trimming or forming thereof.

<Lighting System>

The light emitting device package according to the embodiments may be used as light sources for indicating devices, lighting devices, and display devices. The lighting devices may be used for illumination lamps, traffic lights, vehicle headlights, and signs. The light emitting device package may be provided in plurality. The plurality of light emitting device packages may be arrayed on a board. A light guide plate, an optical sheet, a lens, and a reflective sheet may be disposed on an optical path in which the plurality of light emitting device packages are arrayed. Also, each of the embodiments is not limited to each of the embodiments. Also, each of the embodiments may be selectively applied to other embodiments and may not be limited to each of the embodiments.

The light emitting device package according to the embodiment may be applied to a light unit. The light unit has a structure in which a plurality of light emitting devices or light emitting device packages are arrayed. The light unit may include the display device shown in FIGS. 9 and 10 and the lighting device shown in FIG. 11. Further more, the light unit may include illumination lamps, traffic lights, vehicle headlights, and signs.

Figure 9:
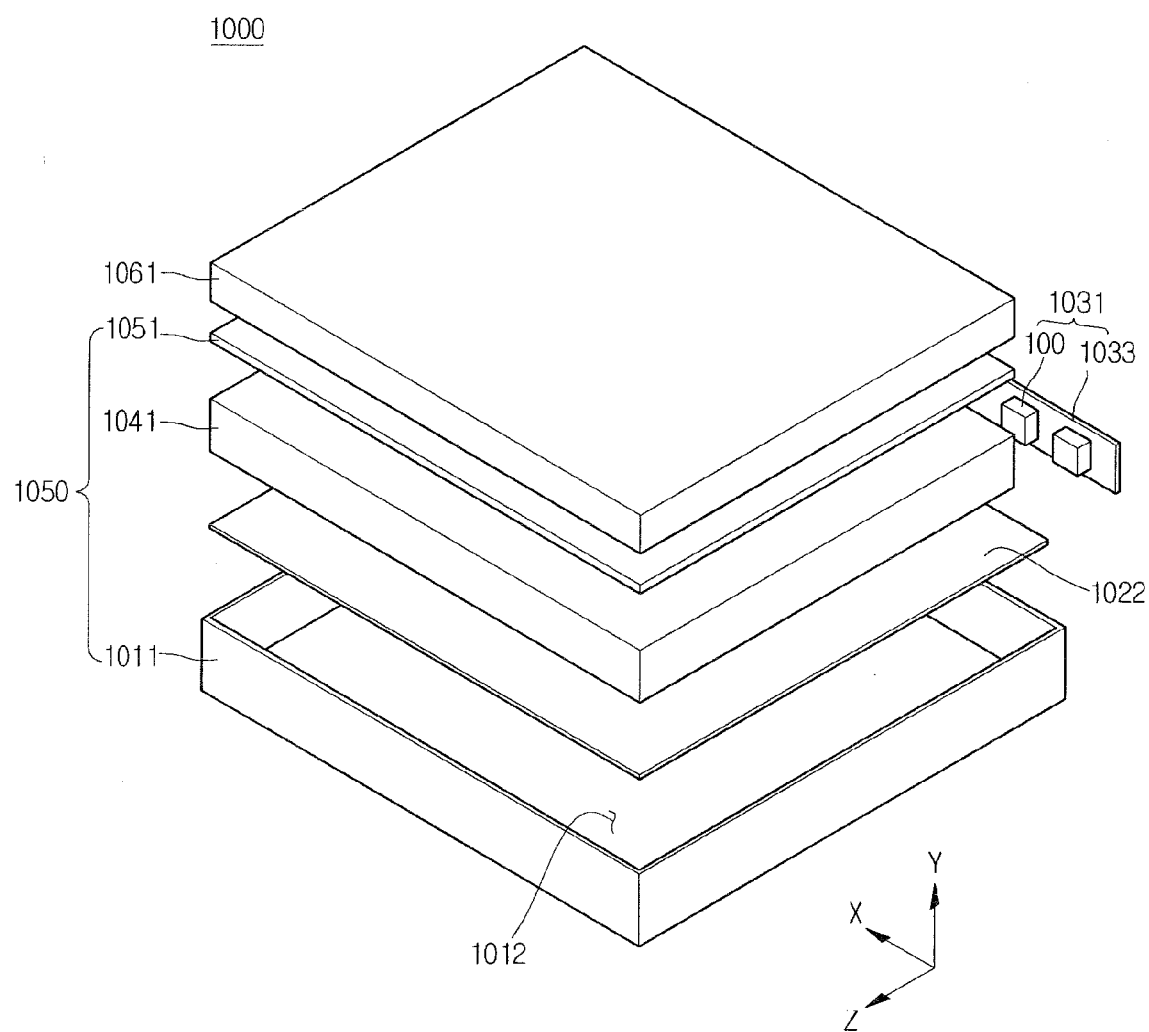
FIG. 9 is a view of a display device including a light emitting device package according to an embodiment.

FIG. 9 is an exploded perspective view of a display device according to an embodiment.

Referring to FIG. 9, a display device 1000 according to an embodiment may include a light guide plate 1041, a light emitting module 1031 providing light to the light guide plate 1041, a reflective member 1022 disposed under the light guide plate 1041, an optical sheet 1051 disposed above the light guide plate 1041, a display panel 1061 disposed above the optical sheet 1051, and a bottom cover 1011 receiving the light guide plate 1041, the light emitting module 1031, and the reflective member 1022, but is not limited thereto.

The bottom cover 1011, the reflective member 1022, the light guide plate 1041, and the optical sheet 1051 may be defined as a light unit 1050.

The light guide plate 1041 diffuses light to produce planar light. The light guide plate 1041 may be formed of a transparent material. For example, the light guide plate 1041 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1031 may provide light to at least one side surface of the light guide plate 1041. Thus, the light emitting module 1031 may act as a light source of a display device.

At least one light emitting module 1031 may be disposed to directly or indirectly provide light to at least one side surface of the light guide plate 1041. The light emitting module 1031 may include a board 1033 and the light emitting device package 100 according to the above-described embodiment. The light emitting device package 100 may be arrayed on the board 1033 by a predetermined distance.

The board 1033 may be a printed circuit board (PCB) including a circuit pattern (not shown). Also, the substrate 1033 may include a general PCB, a metal core PCB, and a flexible PCB, but is not limited thereto. When the light emitting device package 100 are mounted on a side surface of the bottom cover 1011 or on a heatsink plate, the board 1033 may be removed. Here, a portion of the heatsink plate may contact a top surface of the bottom cover 1011.

The plurality of light emitting device packages 100 may be mounted on the board 1033 to allow a light emitting surface through which light is emitted from the board 1033 to be spaced a predetermined distance from the light guide plate 1041, but is not limited thereto. The light emitting device package 100 may directly or indirectly provide light to a light incident surface that is a side surface of the light guide plate 1041, but is not limited thereto.

The reflective member 1022 may be disposed under the light guide plate 1041. Since the reflective member 1022 reflects light incident onto an under surface of the light guide plate 1041 to supply the reflected light upward, brightness of the light unit 1050 may be improved. For example, the reflective member 1022 may be fanned of one of PET, PC, and PVC, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or non-metal material having superior heat conductivity, but is not limited thereto.

For example, the display panel 1061 may be a liquid crystal display (LCD) panel and include first and second boards formed of a transparent material and facing each other and a liquid crystal layer between the first and second boards. A polarizing plate may be attached to at least one surface of the display panel 1061. The present disclosure is not limited to the attached structure of the polarizing plate. The display panel 1061 displays information using light transmitting the optical sheet 1051. The display device 1000 may be applied to various portable terminals, monitors for notebook computers, monitors for laptop computers, televisions, etc.

The optical sheet 1051 is disposed between the display panel 1061 and the light guide plate 1041 and includes at least one light-transmitting sheet. For example, the optical sheet 1051 may include at least one of a diffusion sheet, horizontal and vertical prism sheets, a brightness enhanced sheet, etc. The diffusion sheet diffuses incident light, and the horizontal or/and vertical prism sheet(s) collect(s) the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 10:
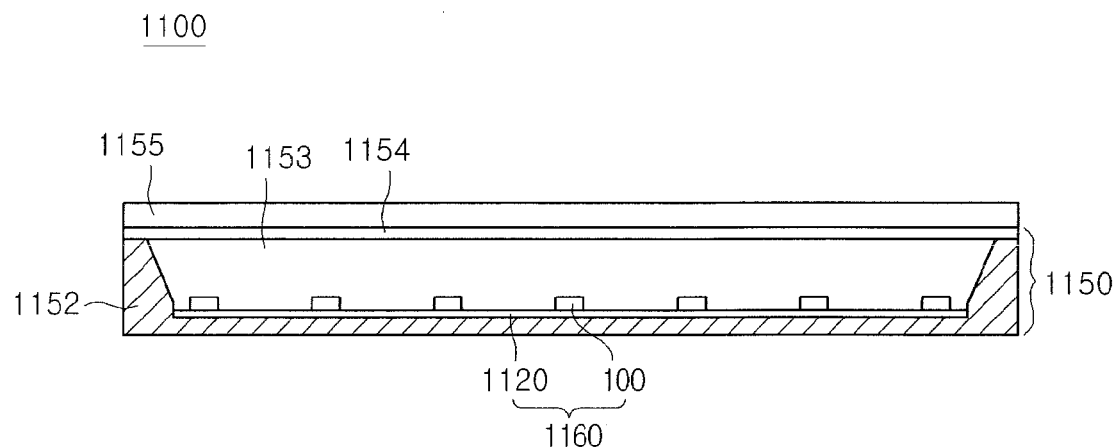
FIG. 10 is a view illustrating another example of the display device including the light emitting device package according to an embodiment.

FIG. 10 is a view illustrating a display device according to an embodiment.

Referring to FIG. 10, a display device 1100 includes a bottom cover 1152, a board 1120 on which the above-described light emitting device packages 100 are arrayed, an optical member 1154, and a display panel 1155.

The board 1120 and the light emitting device package 100 may be defined as a light emitting module 1060. The bottom cover 1152, the at least one light emitting module 1060, and the optical member 1154 may be defined as a light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or PMMA material. In this case, the light guide plate may be removed. The diffusion sheet diffuses incident light, and the horizontal and vertical prism sheets collect the incident light into a display region. The brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

Figure 11:
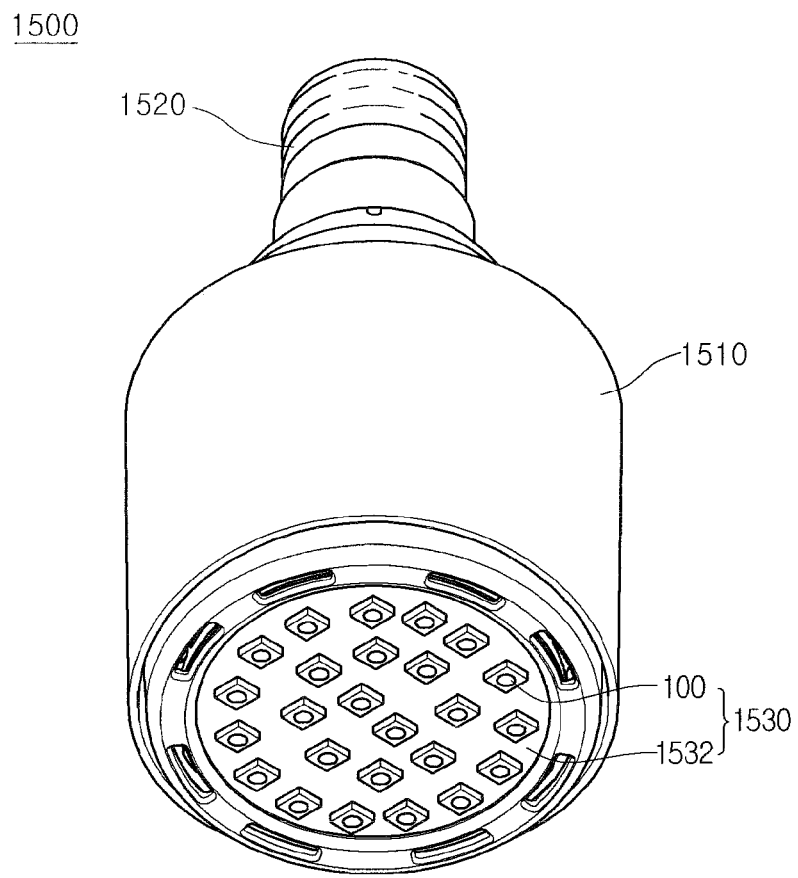
FIG. 11 is a view of a lighting device including the light emitting device package according to an embodiment.

FIG. 11 is a view of a lighting device according to an embodiment.

Referring to FIG. 11, a lighting unit 1500 may include a case 1510, a light emitting module 1530 in the case 1510, and a connection terminal 1520 disposed in the case 1510 to receive an electric power from an external power source.

The case 1510 may be preferably formed of a material having good heat dissipation characteristics, for example, a metal material or a resin material.

The light emitting module 1530 may include a board 1532 and a light emitting device package 100 mounted on the board 1532. The light emitting device package 100 may be provided in plurality, and the plurality of light emitting device packages 100 may be arrayed in a matrix form or spaced a predetermined distance from each other.

The board 1532 may be an insulator on which a circuit pattern is printed. For example, the board may include a general printed circuit board (PCB), a metal core PCB, a flexible PCB, a ceramic PCB, FR-4, etc.

Also, the board 1532 may be formed of a material to efficiently reflect light, and a surface thereof may be farmed in a color capable of efficiently reflecting light. For example, the board 1532 may be a coated layer having a white color or a silver color.

At least one light emitting device package 100 may be mounted on the board 1532. Each of the light emitting device packages 100 may include at least one light emitting diode (LED) chip. The LED chip may include a color LED emitting red, green, blue or white light, and a UV LED emitting ultraviolet (UV) rays.

The light emitting module 1530 may have a combination of various light emitting device packages 100 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screw-coupled to an external power source in a socket type, but is not limited thereto. For example, the connection terminal 1520 may be made in a pin type and inserted into the external power source or may be connected to the external power source through a wire.

The embodiments may improve heat release characteristics in the light emitting device package including a plurality of light emitting diodes. Also, the embodiments may improve the reliability of the light emitting device package including the plurality of light emitting diodes.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body having a cavity;
a plurality of lead frames within the cavity;
a light emitting device on at least one of the plurality of lead frames; and
a moisture permeation prevention member between the body and each of the lead frames,
wherein each of the lead frames includes a first frame disposed within the cavity, a second frame disposed on a lower surface of the body, and a third frame connecting the first frame to the second frame,
the third frame of the lead frames is disposed within the body and at least one portion of the third frame is inclined with respect to the lower surface of the body, and
the moisture permeation prevention member includes a protrusion that protrudes from the third frame of each of the lead frames,
wherein the third frame of the lead frames is disposed between the lower surface of the body and a bottom surface of the cavity.

2. The light emitting device package according to claim 1, wherein the protrusion is formed of a material different from a material of the lead frames.

3. The light emitting device package according to claim 2, wherein the protrusion is formed of a material different from a material of the body.

4. The light emitting device package according to claim 1, wherein the protrusion includes at least one of an adhesion material, a metal material or a resin material.

5. The light emitting device package according to claim 1, wherein the protrusion is disposed on at least one of a top surface or a lower surface of the third frame.

6. The light emitting device package according to claim 1, wherein the protrusion is formed of at least one of a polygonal shape, a ring shape, a band shape or a loop shape.

7. The light emitting device package according to claim 1, wherein the protrusion is formed around the third frame within the body.

8. The light emitting device package according to claim 1, wherein the protrusion includes a first protrusion on a first side of the third frame and a second protrusion on a second side of the third frame opposite to the first side.

9. A lighting system comprising:
a light emitting device package of claim 1; and
an optical member on an optical path of the light emitting device package.

10. A light emitting device package comprising:
the body having a cavity;
a plurality of lead frames within the cavity;
a light emitting device on at least one of the plurality of lead frames;
a molding member in the cavity; and
a moisture permeation prevention member between the body and each of the lead frames,
wherein each of the lead frames includes a first frame disposed within the cavity, a second frame disposed on a lower surface of the body, and a third frame connecting the first frame to the second frame,
the third frame of the lead frames is disposed within the body and at least one portion of the third frame is inclined with respect to the lower surface of the body, and the moisture permeation prevention member includes a protrusion that protrudes from an inclined surface of the third frame,
wherein the third frame of the lead frames is formed in a straight-line shape between the lower surface of the body and a bottom surface of the cavity.

11. The light emitting device package according to claim 10, wherein the protrusion is formed of a material different from a material of the lead frames.

12. The light emitting device package according to claim 10, wherein the protrusion is formed of a resin material different from a material of the body.

13. The light emitting device package according to claim 10, wherein the protrusion includes at least one of an adhesion material, a metal material or a resin material.

14. The light emitting device package according to claim 10, wherein the protrusion is disposed on at least one of a top surface or a lower surface of the third frame.

15. The light emitting device package according to claim 10, wherein the protrusion is formed around the third frame within the body.

16. The light emitting device package according to claim 10, wherein a first end portion of the third frame is folded from the first frame of each of the lead frames in the body, and a second end portion of the third frame is folded from the second frame of each of the lead frames in the body.

17. The light emitting device package according to claim 10, wherein the protrusion is formed of a silicon or epoxy material.

18. The light emitting device package according to claim 10, wherein the protrusion includes a first protrusion on a first side of the third frame and a second protrusion on a second side of the third frame opposite to the first side.

19. A lighting system comprising:
a board;
a plurality of light emitting device packages on the board; and
an optical member disposed on an optical path of the plurality of light emitting device packages,
wherein each of the light emitting device packages comprises:
a body having a cavity,
a plurality of lead frames within the cavity,
a light emitting device on at least one of the plurality of lead frames, and
a moisture permeation prevention member between the body and each of the lead frames,
wherein each of the lead frames includes a first frame disposed within the cavity, a second frame disposed on a lower surface of the body, and a third frame connecting the first frame to the second frame,
the third frame of the lead frames is disposed within the body and at least one portion of the third frame is inclined with respect to the lower surface of the body, and
the moisture permeation prevention member includes a protrusion that protrudes from the third frame of each of the lead frames,
wherein the third frame of the lead frames is disposed between the lower surface of the body and a bottom surface of the cavity.

20. The lighting system according to claim 19, wherein the third frame is formed in a straight-line shape.

* * * * *